United States Patent
Jaklin et al.

(10) Patent No.: US 7,722,405 B2
(45) Date of Patent: May 25, 2010

(54) ELECTRONIC DEVICE

(75) Inventors: Ralf Jaklin, Liederbach (DE); Horst Ullrich, Schoeneck (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 11/791,551

(22) PCT Filed: Oct. 14, 2005

(86) PCT No.: PCT/EP2005/055267

§ 371 (c)(1),
(2), (4) Date: May 23, 2007

(87) PCT Pub. No.: WO2006/056512

PCT Pub. Date: Jun. 1, 2006

(65) Prior Publication Data

US 2008/0081517 A1     Apr. 3, 2008

(30) Foreign Application Priority Data

Nov. 26, 2004   (DE) ................. 10 2004 057 404
Dec. 16, 2004   (DE) ................. 10 2004 060 694

(51) Int. Cl.
*H01R 25/00* (2006.01)
(52) U.S. Cl. ................................... 439/638
(58) Field of Classification Search ............. 439/638, 439/79, 441, 544, 455, 447, 466, 606, 502, 439/565, 552, 76.1; 361/752
See application file for complete search history.

(56) References Cited

U.S. PATENT DOCUMENTS

| | | | |
|---|---|---|---|
| 4,813,885 A | 3/1989 | Colleran et al. | |
| 5,295,859 A * | 3/1994 | Kawai et al. | ................. 439/455 |
| 5,445,528 A | 8/1995 | Frantz | |
| 5,836,789 A | 11/1998 | Kourimsky et al. | |
| 6,039,582 A | 3/2000 | Geis et al. | |
| 6,160,708 A | 12/2000 | Loibl et al. | |
| 6,193,564 B1 | 2/2001 | Loibl et al. | |
| 6,386,917 B1 * | 5/2002 | Sakaguchi | ................. 439/606 |
| 2002/0149916 A1 | 10/2002 | Kurle et al. | |
| 2004/0161975 A1 | 8/2004 | Sakai et al. | |

FOREIGN PATENT DOCUMENTS

| | | |
|---|---|---|
| DE | 42 08 765 | 8/1993 |
| DE | 195 03 778 | 8/1996 |
| DE | 196 32 817 | 2/1997 |
| EP | 0 349 125 | 1/1990 |
| GB | 2 263 817 | 8/1993 |

OTHER PUBLICATIONS

International Search Report issued in a corresponding foreign application.

Written Report dated Jan. 3, 2006 issued in corresponding application 2004P19942WO.

* cited by examiner

*Primary Examiner*—Edwin A. Leon
(74) *Attorney, Agent, or Firm*—Cohen Pontani; Lieberman & Pavane LLP

(57) ABSTRACT

The invention relates to an electronic device with a housing to accommodate a support substrate, provided with an electronic circuit, whereby the electronic circuit makes contact with at least one electrical line, leading out of the housing. The electrical line is connected to a rigid contact element on a contact holder and the contact element is introduced into the support substrate to make contact with the electronic circuit.

11 Claims, 6 Drawing Sheets

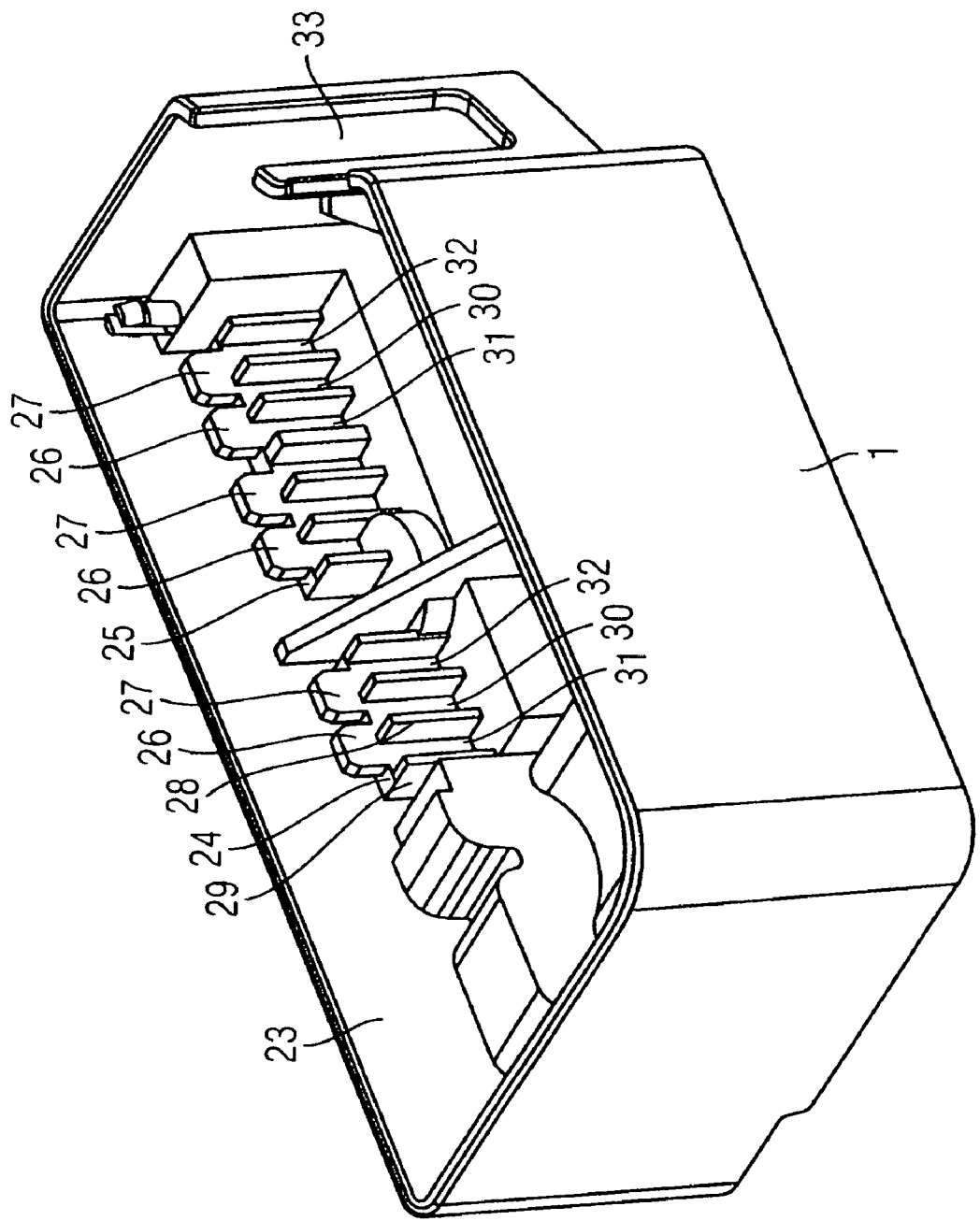

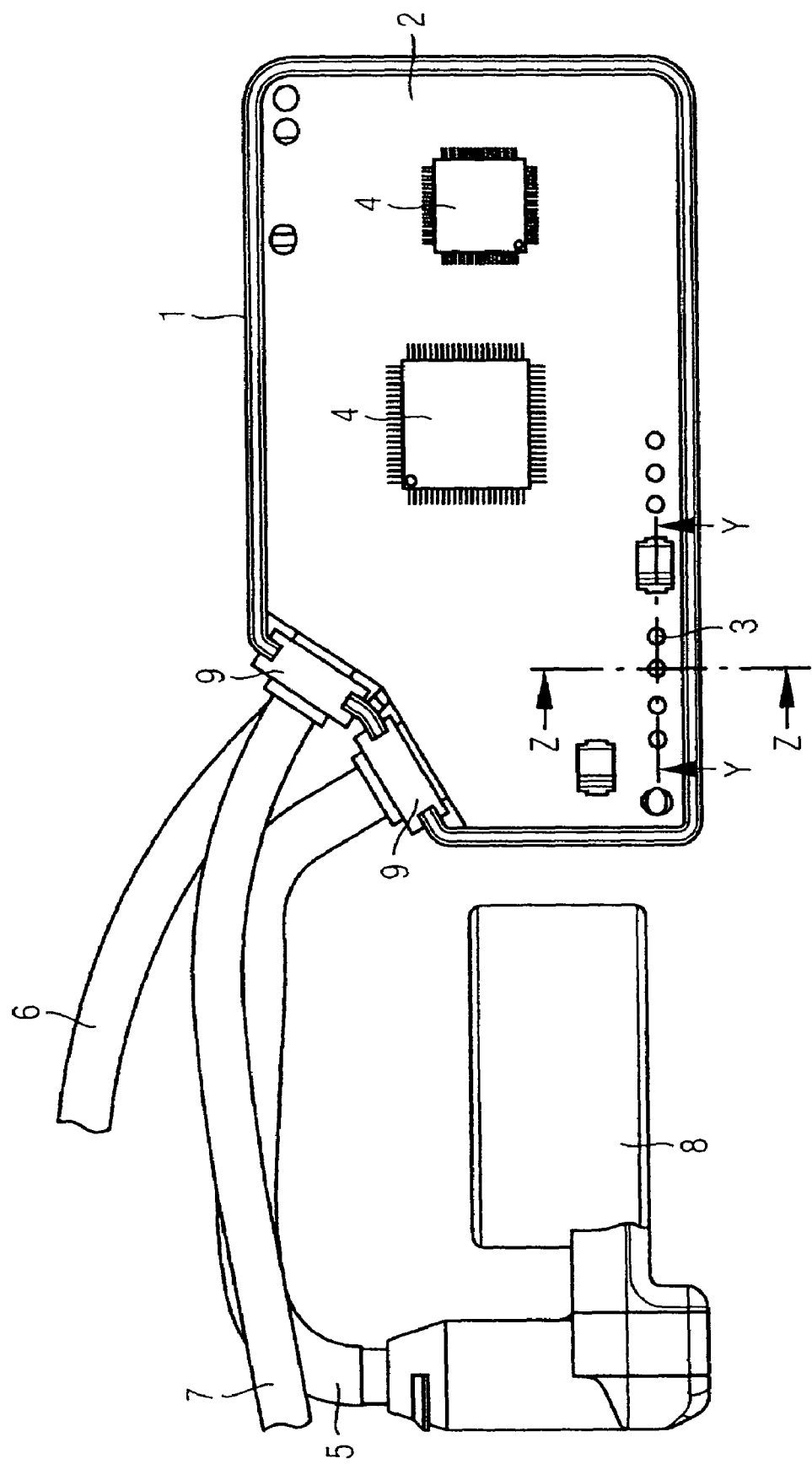

Y-Y

Z-Z

ELECTRONIC DEVICE

CROSS REFERENCE TO RELATED APPLICATIONS

This is a U.S. national stage of application No. PCT/EP2005/0552367, filed on 14 Oct. 2005. Priority is claimed on DE 10 2004 057 404.9, filed 26 Nov. 2004 and DE 10 2004 060 694.3, filed 16 Dec. 2004, the contents of which are incorporated here by reference.

BACKGROUND OF THE INVENTION

1. Field of the Invention

The invention relates to an electronic device having a housing for accommodating a support substrate which supports an electronic circuit, with at least one electrical line, which is routed out of the housing, making contact with the electronic circuit.

2. Description of the Prior Art

In motor-vehicle electronics, the electronic circuits for controlling individual vehicle functions are arranged on a printed circuit board which is arranged in a housing directly at the location of the actuating drive to be controlled. In this case, the electronic circuit is connected to the vehicle-body side by means of cables. The cable ends make contact with the printed circuit board by the individual lines of the cable being threaded through holes in the printed circuit board and then soldered.

In mass production, this leads to a high error rate in the production of such control units. A further disadvantage is that the soldered connections become loose on account of the high vibration requirements in the motor vehicle, and this leads to electrical breakdowns.

SUMMARY OF THE INVENTION

An object of the present invention is to provide an electronic device which meets the increased vibration requirements in the motor vehicle and can be produced in a simple and cost-effective manner.

According to an embodiment of the invention, the object is achieved in that an electrical line or conductor is connected to an inflexible contact element of a contact holder, and in that the contact element is inserted into a support substrate in order to make contact with an electronic circuit.

The advantage of the invention is that a prefabricated subassembly, comprising the contact element, contact holder and line, constitutes a connection technique which is particularly suitable for mass production since all of the elements required for making electrical contact are fitted in just one installation step. This connection technique also reliably prevents the contacts becoming loose due to vibration phenomena in the motor vehicle.

The contact element advantageously projects beyond the contact holder at least on one side, with the electrical line being connected to the contact holder at one end of said contact holder. Various techniques are possible for connection purposes. For example, the contact element and the electrical line can be soldered or welded. As an alternative, the electrical line is positioned parallel to one end of the contact element, with said electrical line and contact element being crimped or spliced to one another.

In one embodiment, the contact holder is inserted into a contact holder receptacle which is arranged on the housing wall arrangement, and the support substrate is placed on the contact holder. The contact elements are positioned in relation to the printed circuit board by virtue of the contact holder being firmly installed on the housing. As a result, the contact holder simultaneously serves as an adjustment means for the support substrate.

For the purpose of simple fitting of the contact holder, the contact holder receptacle has a plug-on peg behind which the contact holder engages. As a result, the contact holder is simply just plugged onto the contact holder receptacle.

In order for the feed lines to be laid in the housing in an ordered manner, the contact holder receptacle has a base in which cable receptacles are formed.

A seal, which is pushed into an opening in the housing wall arrangement, is advantageously pushed over a cable which combines a plurality of electrical lines. This seal, which represents a part of the housing wall arrangement, leads to the housing being tightly closed and forms a structural unit which can be prefabricated together with the cable holder, the contact elements and the cable.

BRIEF DESCRIPTION OF THE DRAWINGS

The invention permits numerous embodiments. One of these embodiments will be explained with reference to the figures which are illustrated in the drawing, in which.

DETAILED DESCRIPTION OF THE PREFERRED EMBODIMENTS

Figure 1:
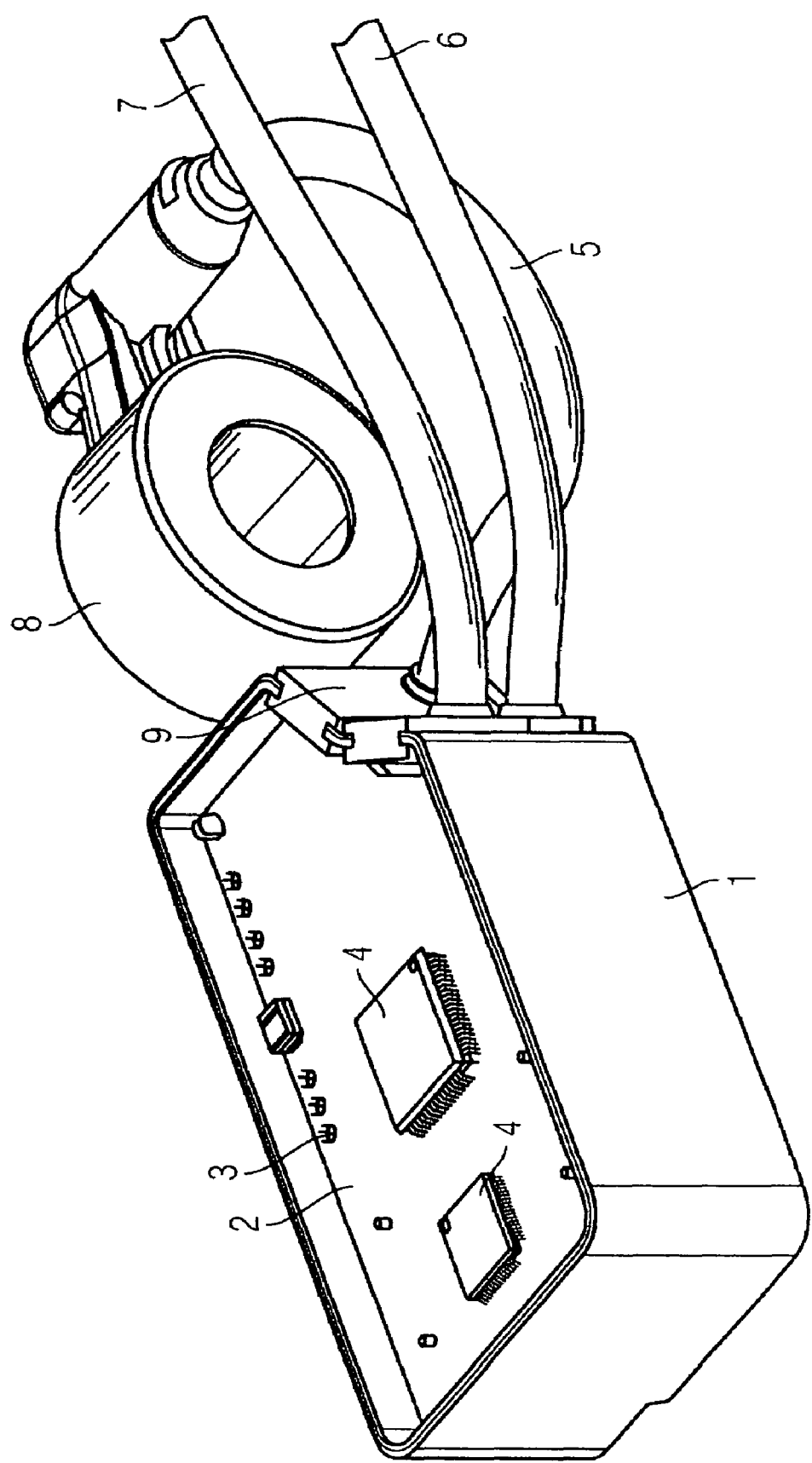
FIG. 1: is a perspective view of a closed control unit according to an embodiment of the present invention.

FIG. 1 illustrates a control unit for use on the shock absorbers of a motor vehicle, which control unit regulates the flow of hydraulic liquid through a valve. The control unit has an integral pot-like housing 1 which is composed of plastic and is produced as an injection-molded part. The housing 1 is covered by a printed circuit board 2 which supports electrical components 4 which contain the regulation means for the shock absorber valve. The connection wires of the cables 5, 6, 7 which electrically connect the control unit to the surroundings extend through the contact openings 3 in the printed circuit board 2. In this case, the line 5 is connected to a coil 8 which serves for inductive energy transfer of the valve (not illustrated any further). On one side, the housing 1 has seals 9 which are each pushed over a cable 5, 6, 7 and at the same time are inserted into the housing wall as part of the housing wall arrangement.

Figure 2:
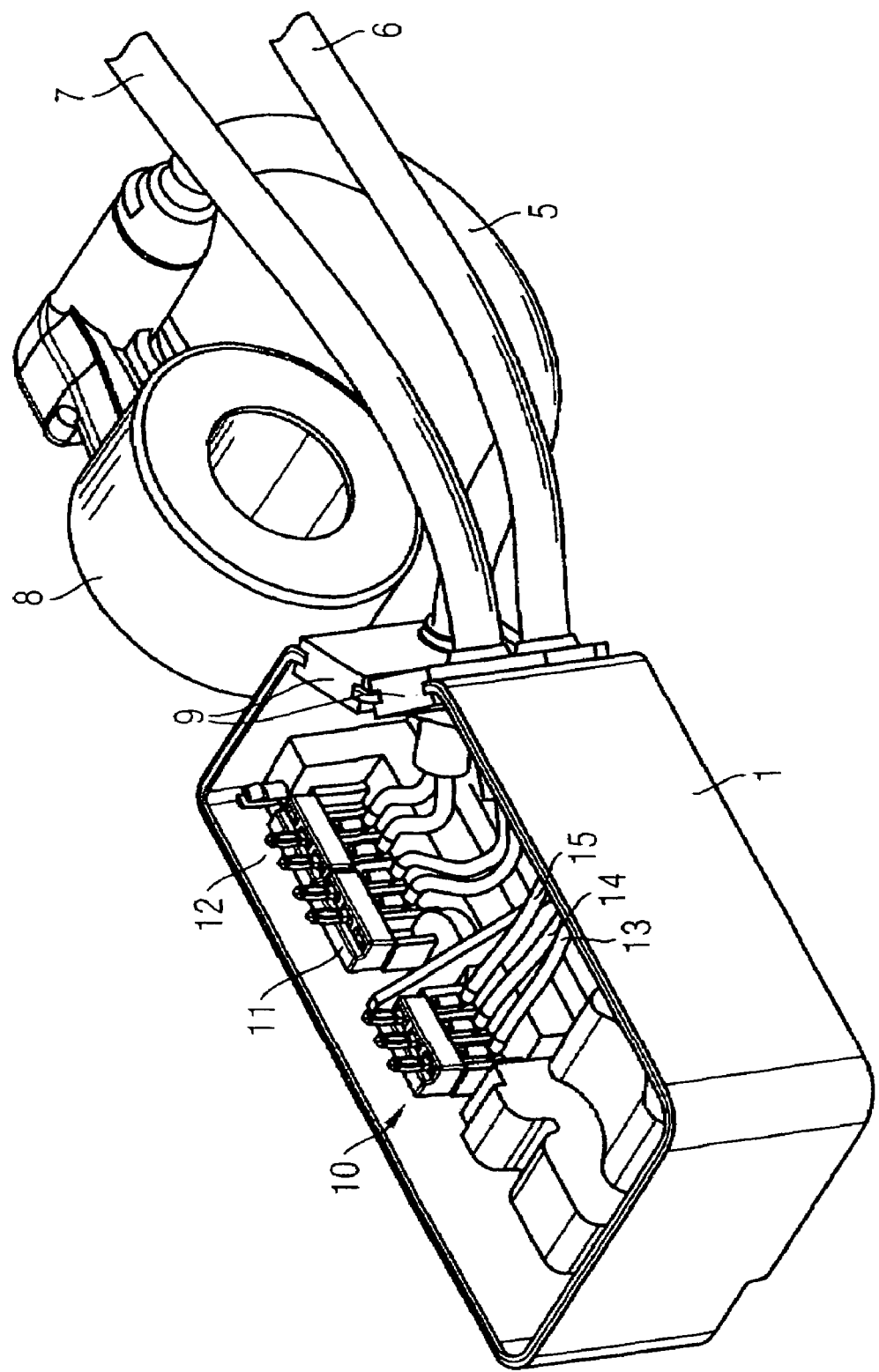
FIG. 2: is a perspective view of the control unit of FIG. 1 without the printed circuit board.

In FIG. 2, the housing 1 is illustrated without the printed circuit board which simultaneously serves as a cover of the housing. Contact holders 10, 11, 12 are arranged in the interior of the housing, with the conductors 13, 14, 15 of the cable 6 being routed to the contact holder 10, while the conductor 39, 40 of the cable 7 are routed to the contact holders 11, and the conductors 41, 42 of the cable 5 are routed to the contact holder 12.

Figure 3:
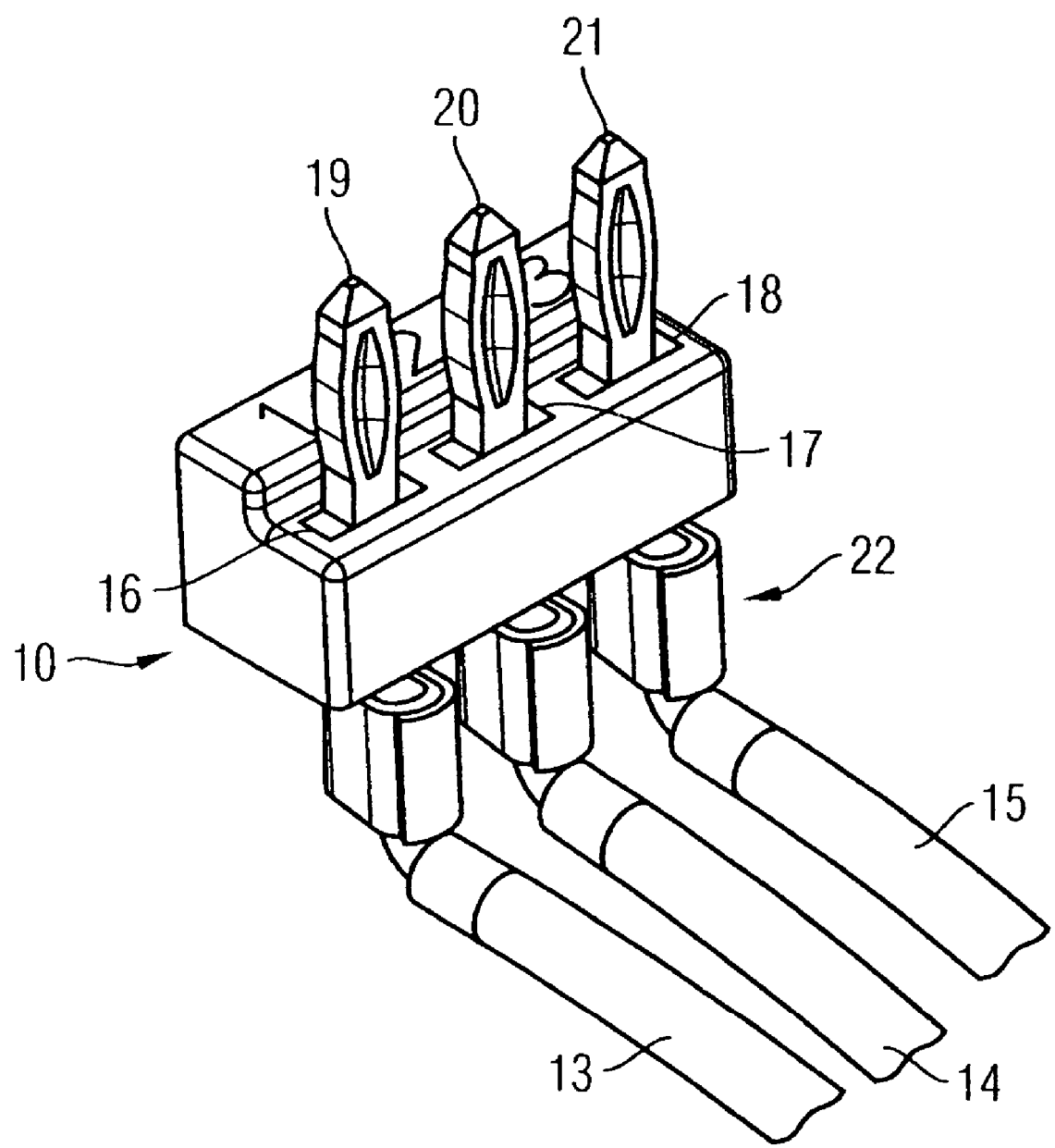
FIG. 3: is a perspective view of a contact holder of the control unit of FIG. 1, FIG. 4: is a perspective view of a control unit housing of the control unit of FIG. 1, FIG. 5: is a plan view of the closed control unit of FIG. 1, and FIG. 6a-6b: are sectional views of the control unit of FIG. 5.

The further design of the contact holders 10, 11, 12 will be explained using the example of the contact holder 10 with the aid of FIG. 3. The contact holder 10 has three openings 16, 17, 18, with an inflexible press-in pin 19, 20, 21 being inserted into each opening in such a way that part of the press-in pin protrudes beyond the top of the contact holder 10. These parts then engage in the contact openings 3 in the printed circuit board 2. The press-in pins 19, 20, 21 also protrude beyond the lower face of the contact holder 10 and there are connected to the stripped part of the conductors 13, 14, 15 of the cable 6. In this exemplary embodiment, the lower end of the press-in pins 19, 20, 21 is spliced to the stripped end of the line 13, 14 or 15 by a metal sheet 22 being wound around and pinching the two ends.

FIG. 4 illustrates the pot-like housing 1, with contact holder receptacles 24 and 25 being integrally formed from the housing on a side wall 23. These contact holder receptacles have pegs 26 and 27. These pegs 26 and 27 are integrally formed on a base 29 which is divided into various channels 30, 31, 32 by side walls 28. Furthermore, an opening 33 for accommodating the seals 9 is visible in the side of the housing wall arrangement.

FIG. 5 illustrates a plan view of the exemplary embodiment, with sectional directions Y and z being identified in particular, these directions being explained in greater detail in connection with FIG. 6.

Figure 6A:
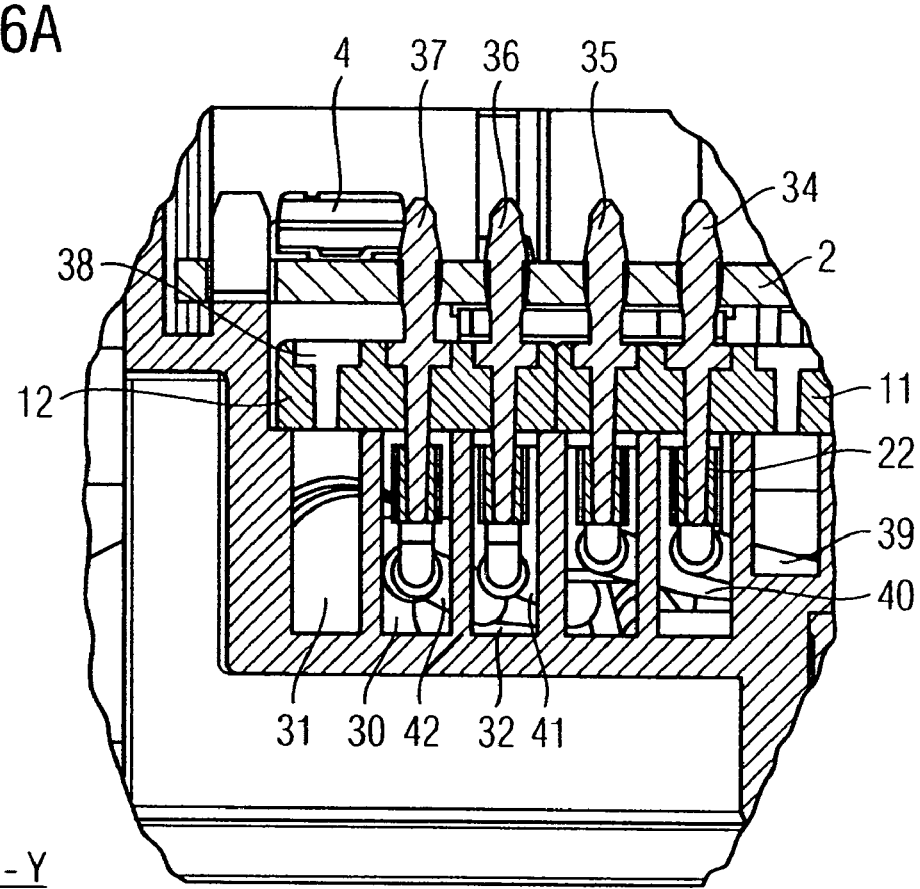
Figure 6B:
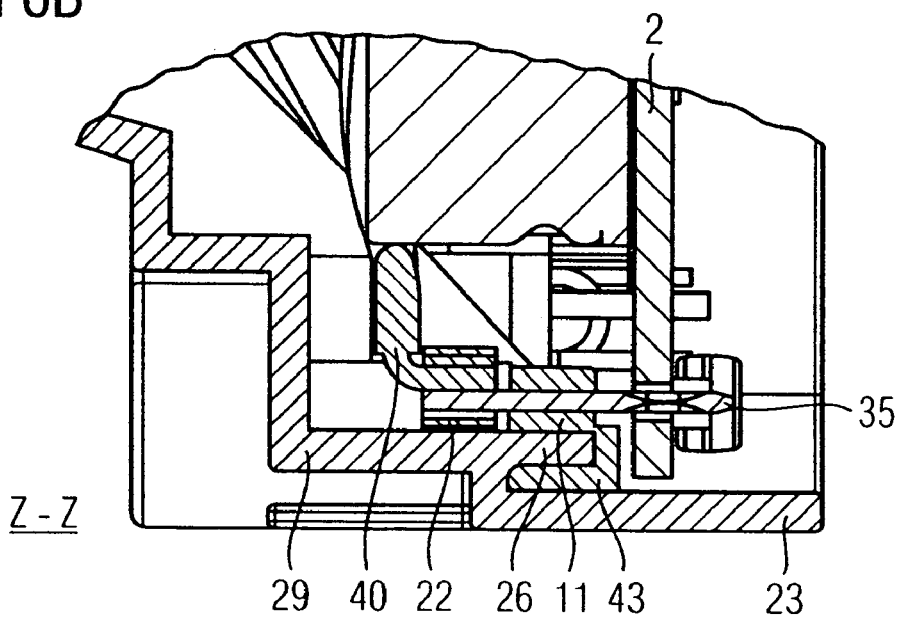

FIG. 6a shows a Y-Y section through the control unit. The contact holders 12 and 11 can be seen on said control unit, these contact holders each engaging in the printed circuit board 2 by means of the press-in pins 36 and 37 and, respectively, 34 and 35, and in the process producing the electrical connection from the cables 5 and 7 to the components 4. As can be seen, the press-in pins in the cable holder 12 or 11 can be populated as required. For example, no electrical line is fitted to the cable channel 31, which is why the cable holder remains unpopulated at this point in this case. The cores 41 and 42 of the cable 5 adjoin the press-in pins 36 and 37, whereas the cable 7 is routed to the press-in pins 34 and 35 of the contact holder 11 by means of the cores 39 and 40.

The Z-Z section illustrates the cable holder 11 which surrounds a peg 26 of the base 29 with the aid of a lug 43 and is therefore arrested against the housing wall arrangement 23. It can also be seen here that the press-in pin 35 makes contact with the printed circuit board 2.

What is claimed is:

1. An electronic device, comprising:
    a housing;
    a support substrate accommodated in said housing and supporting an electronic circuit;
    at least one electrical conductor routed out of said housing; and
    a substantially rigid contact element disposed in a contact holder and connected to said electrical conductor, said contact element projecting beyond a top and a bottom of the contact holder and being inserted into said support substrate such that said contact element makes electrical contact with said electronic circuit.

2. The device of claim 1, wherein said electrical conductor is part of a cable having a plurality of electrical conductors, said housing having a wall arrangement defining an opening, and said device further comprising a seal pushed into the opening defined in said housing wall arrangement and pushed over said cable.

3. The electronic device of claim 1, wherein said contact element projects beyond at least one side of said contact holder, wherein said electric conductor is connected to one end of said contact element.

4. The device of claim 3, wherein said contact element is a press-in element.

5. The device of claim 3, wherein said contact element is connected to the electrical conductor by one of a soldered or welded connection.

6. The device of claim 3, wherein said electrical conductor is positioned parallel to one end of said contact element, said electrical conductor being connected to said contact element by one of a crimped or spliced connection.

7. The device of claim 1, further comprising a contact holder receptacle defined in said housing by a housing wall arrangement, wherein said contact holder is inserted into said contact holder receptacle, and said support element is placed on said contact holder.

8. The device of claim 7, wherein said contact holder receptacle includes a plug-on peg, and wherein said contact holder engages behind said plug-on peg of said contact holder receptacle.

9. The device of claim 7, wherein said contact holder receptacle has a base in which a cable receptacle is defined.

10. An electronic device, comprising:
    a housing;
    a support substrate accommodated in said housing and supporting an electronic circuit;
    at least one electrical conductor routed out of said housing; and
    a substantially rigid contact element disposed in a contact holder and connected to said electrical conductor, said contact holder being supported below said electronic circuit, said contact element projecting beyond a top and a bottom of the contact holder and being inserted into said support substrate such that said contact element makes electrical contact with said electronic circuit, and said contact holder and said electronic circuit being supported by said housing.

11. The device of claim 10, wherein the support holder includes at least one of a base, pegs, and sidewalls defining cable channels.

* * * * *